(12) United States Patent
Starr et al.

(10) Patent No.: US 6,832,173 B1
(45) Date of Patent: Dec. 14, 2004

(54) TESTING CIRCUIT AND METHOD FOR PHASE-LOCKED LOOP

(75) Inventors: Gregory Starr, San Jose, CA (US); Wanli Chang, Saratoga, CA (US)

(73) Assignee: Altera Corporation, San Jose, CA (US)

(*) Notice: Subject to any disclaimer, the term of this patent is extended or adjusted under 35 U.S.C. 154(b) by 43 days.

(21) Appl. No.: 10/209,633

(22) Filed: Jul. 30, 2002

(51) Int. Cl.⁷ .............................. G01R 35/00; H03L 7/06
(52) U.S. Cl. ........................ 702/106; 327/157; 331/16; 375/130; 375/376
(58) Field of Search ............................. 702/35, 60, 64, 702/69, 67, 86, 112, 106, 117, 118, 123, 124, 176; 73/861.356; 324/76.82, 76.53, 158.1, 613; 327/149, 150, 156, 158, 198, 262, 147, 159; 326/38, 39, 95; 375/130, 374, 375, 376; 455/258, 260

(56) References Cited

U.S. PATENT DOCUMENTS

| | | | |
|---|---|---|---|
| 4,494,021 A | 1/1985 | Bell et al. ................... 307/591 |
| 4,633,488 A | 12/1986 | Shaw ......................... 375/120 |
| 4,719,593 A | 1/1988 | Threewitt et al. ........... 364/900 |
| 4,868,522 A | 9/1989 | Popat et al. ................... 331/2 |
| 4,959,646 A | 9/1990 | Podkowa et al. ....... 340/825.83 |
| 5,072,195 A | 12/1991 | Graham et al. ................ 331/2 |
| 5,075,575 A | 12/1991 | Shizukuishi et al. ........ 307/465 |
| 5,079,519 A | 1/1992 | Ashby et al. ............... 331/1 A |
| 5,133,064 A | 7/1992 | Hotta et al. ................. 395/550 |
| 5,204,555 A | 4/1993 | Graham et al. ............. 307/465 |
| 5,349,544 A | 9/1994 | Wright et al. ............... 364/600 |
| 5,397,943 A | 3/1995 | West et al. .................... 326/39 |
| 5,418,499 A | 5/1995 | Nakao ......................... 331/57 |
| 5,420,544 A | 5/1995 | Ishibashi ..................... 331/11 |
| 5,506,878 A | 4/1996 | Chiang ........................ 377/39 |
| 5,542,083 A | 7/1996 | Hotta et al. ................. 395/550 |
| 5,646,564 A | 7/1997 | Erickson et al. ............ 327/158 |
| 5,656,959 A | 8/1997 | Chang et al. ................ 327/105 |

(List continued on next page.)

FOREIGN PATENT DOCUMENTS

| | | |
|---|---|---|
| EP | 0 266 065 | 5/1988 |
| EP | 0 416 930 | 3/1991 |
| EP | 0 778 517 | 6/1997 |
| JP | 1-137646 | 5/1989 |

OTHER PUBLICATIONS

DynaChip Corp., DY6000 Family Datasheet (Dec. 1998).
Ko, U., et al., "A 30-ps Jitter, 3.6 μs Locking, 3.3-Volt Digital PLL for CMOS Gate Arrays," *Proceedings of the IEEE 1993 Custom Integrated Circuits Conference*, Publication No. 0-7803-0826-3/93, pp. 23.3.1-23.3.4 (May 9-12, 1993).
LSI Logic Corp., 500K Technology Design Manual (Document DB04-000062-00, First Edition), pp. 8-1—8-33 (Dec. 1996).

(List continued on next page.)

*Primary Examiner*—Michael Nghiem
*Assistant Examiner*—John Le
(74) *Attorney, Agent, or Firm*—Fish & Neave; Jeffrey H. Ingerman

(57) ABSTRACT

A testing circuit and method for a phase-locked loop allow measurement of leakage currents in the phase-locked loop components. By forcing the output of the phase-frequency detector to a particular state, the charge pump can be disabled. This disables the effect of feedback in the phase-locked loop, and allowing the output frequency to be determined by the voltage on the control voltage node at the time the feedback is disabled. If there is no leakage, the control voltage, and therefore the output frequency, should remain the same as they were at the moment feedback was disabled. Monitoring the output frequency for changes provides an indication of the presence or absence of leakage. Conducting the test using two different charge pump reference currents allows one to detect leakage resulting from charge pump mismatch.

56 Claims, 7 Drawing Sheets

U.S. PATENT DOCUMENTS

| | | | |
|---|---|---|---|
| 5,699,020 A | 12/1997 | Jefferson | 331/17 |
| 5,742,180 A | 4/1998 | DeHon et al. | 326/40 |
| 5,744,991 A | 4/1998 | Jefferson et al. | 327/158 |
| RE35,797 E | 5/1998 | Graham et al. | 326/40 |
| 5,777,360 A | 7/1998 | Rostoker et al. | 257/315 |
| 5,815,016 A | 9/1998 | Erickson | 327/158 |
| 5,847,617 A | 12/1998 | Reddy et al. | 331/57 |
| 5,900,757 A | 5/1999 | Aggarwal et al. | 327/198 |
| 5,987,543 A | 11/1999 | Smith | 710/70 |
| 6,014,048 A | 1/2000 | Talaga, Jr. et al. | 327/156 |
| 6,069,506 A | 5/2000 | Miller, Jr. et al. | 327/156 |
| 6,069,507 A | 5/2000 | Shen et al. | 327/156 |
| 6,252,419 B1 | 6/2001 | Sung et al. | 326/38 |
| 6,292,507 B1 * | 9/2001 | Hardin et al. | 375/130 |
| 6,373,278 B1 | 4/2002 | Sung et al. | 326/38 |
| 6,396,889 B1 * | 5/2002 | Sunter et al. | 375/376 |
| 6,400,129 B1 * | 6/2002 | Yamaguchi et al. | 324/76.82 |
| 6,624,705 B1 * | 9/2003 | Huard et al. | 331/16 |
| 6,628,739 B1 * | 9/2003 | Hayashi | 375/376 |
| 6,633,185 B2 * | 10/2003 | Starr | 327/157 |
| 2003/0119466 A1 * | 6/2003 | Goldman | 455/260 |

OTHER PUBLICATIONS

Advanced Micro Devices, Inc., "Am2971 Programmable Event Generator (PEG)," Publication No. 05280, Rev. C, Amendment /0, pp. 4–286—4–303 (Jul. 1986).

Advanced Micro Devices, Inc., "AmPAL*23S8 20–Pin IMOX PAL–Based Sequencer," Publication No. 06207, Rev. B, Amendment /0, pp. 4–102—4–121 (Oct. 1986).

DynaChip Corp., "Application Note: Using Phase Locked Loops in DL6035 Devices" (1998).

Lucent Technologies, Inc., Optimized Reconfigurable Cell Array (ORCA™) OR3Cxxx/OR3Txxx Series Field–Programmable Gate Arrays, Preliminary Product Brief, (Nov. 1997).

Lucent Technologies, Inc., ORCA® Series 3 Field–Programmable Gate Arrays, Preliminary Data Sheet, Rev. 01 (Aug. 1998).

Monolithic Memories, Inc., "Programmable Array Logic PAL20RA10–20 Advance Information," pp. 5–95—5–102 (Jan. 1988).

National Semiconductor Corp., *LVDS Owner's Manual & Design Guide* (Apr. 25, 1997).

National Semiconductor Corp., "DS90CR285/DS90CR286 +3.3V Rising Edge Data Strobe LVDS 28–Bit Channel Link–66 MHZ," (Mar. 1998).

Xilinx, Inc., Virtex 2.5V Field Programmable Gate Arrays Advance Product Specification (Version 1.0) (Oct. 20, 1998).

Xilinx, Inc., Application Note: Using the Virtex Delay–Locked Loop (Version 1.31) (Oct. 21, 1998).

Zaks, R., et al., *From Chips to Systems: An Introduction to Microcomputers*, pp. 54–61 (Prentice–Hall, Inc., Englewood Cliffs, N.J., 1987).

* cited by examiner

TESTING CIRCUIT AND METHOD FOR PHASE-LOCKED LOOP

BACKGROUND OF THE INVENTION

This invention relates to phase-locked loops. More particularly, this invention relates to a method and apparatus for testing a phase-locked loop, and to circuitry for facilitating such testing.

The use of phase-locked loops for generating clock and frequency standards is well known. At its most basic, a phase-locked loop ("PLL") includes, in series, a phase-frequency detector having a first input to which a reference frequency is applied, a charge pump, a loop filter and a voltage-controlled oscillator ("VCO"). The output of the VCO, which is the output of the PLL, is fed back to a second input of the phase-frequency detector. Any phase variance between the reference signal and the feedback signal causes the phase-frequency detector to generate a voltage which is input to the charge pump and loop filter, which output a control voltage to the voltage-controlled oscillator. The PLL output signal keeps changing as the control voltage changes until there is a match between the frequencies of the output and the reference signal, which is detected by the phase-frequency detector. At that point, the PLL is considered to be locked.

Known methods for testing a PLL test whether or not the PLL is capable of locking on a reference signal. However, even if the PLL locks, it may nevertheless be subject to drift if there is excessive leakage current in, e.g., the charge pump or the loop filter, resulting in a phase variance between the input signal and the output signal. It would be desirable to be able to provide a method for testing a PLL that would be capable of detecting such leakage currents or their effects, apparatus for performing such a test and a PLL adapted for such a test.

SUMMARY OF THE INVENTION

It is an advantage of the present invention that it provides a method for testing a PLL that would be capable of detecting such leakage currents or their effects, apparatus for performing such a test and a PLL adapted for such a test.

In accordance with the present invention, there is provided a method of testing a phase-locked loop. The method includes inputting a reference signal to the phase-locked loop, allowing the phase-locked loop to lock onto the reference signal, discontinuing feeding back of the loop output, and monitoring the loop output, after the discontinuing, for a change in the output frequency. Apparatus for performing such a test, and a phase-locked loop adapted to be so tested, are also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

In accordance with the present invention, phase-locked loops may be more thoroughly tested. In addition to testing whether or not a PLL is capable of locking onto a reference signal, the testing method according to the present invention determines whether or not there are leakage currents in the charge pump and/or loop filter that may affect the output signal, causing, e.g., a phase variance or misalignment in the output signal. The present invention also provides a testing apparatus for PLLs and a PLL circuit adapted for testing according to the method of the invention.

Figure 1:
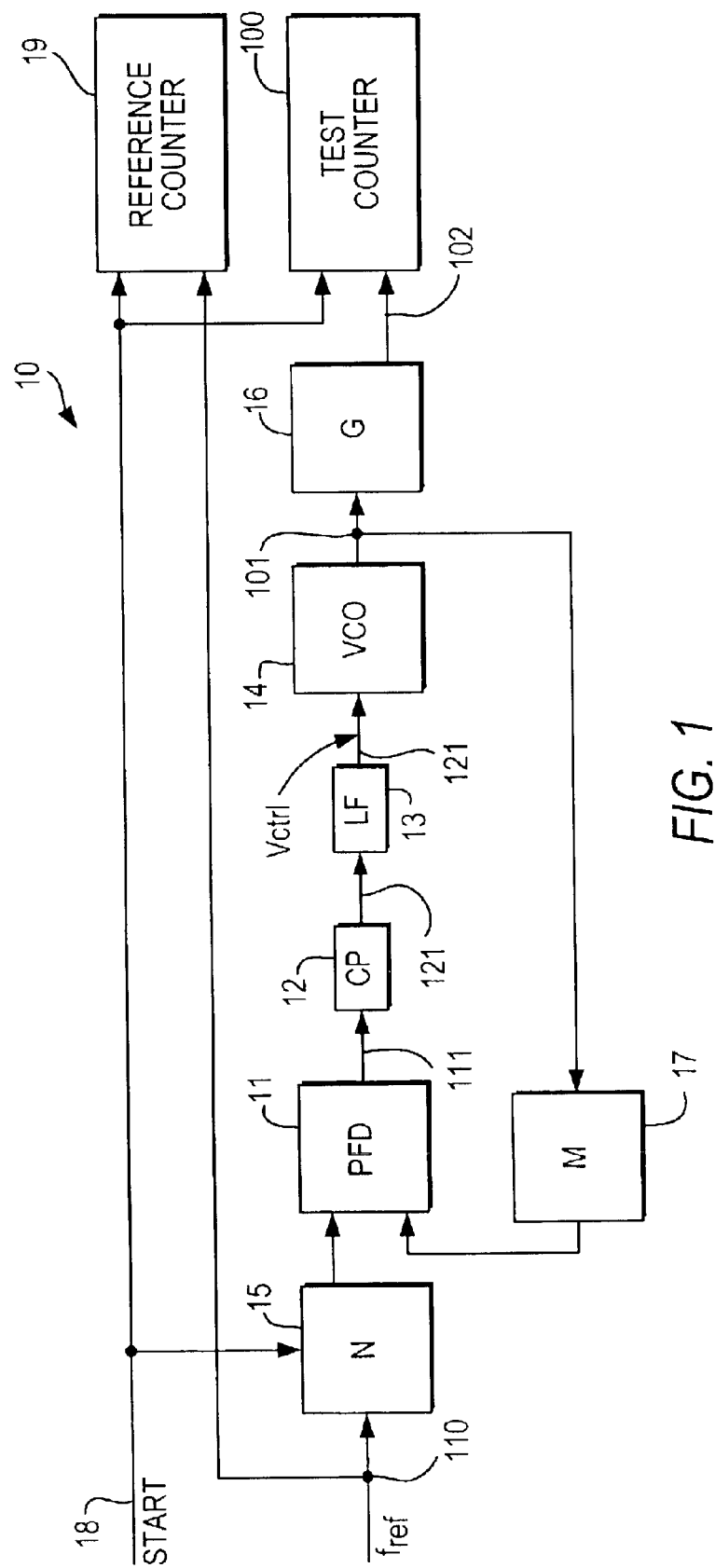
FIG. 1 is a schematic diagram of a phase-locked loop circuit adapted to be tested in accordance with the present invention.

A phase-locked loop circuit 10 in accordance with the present invention is shown in FIG. 1. Although PLL circuit 10 is particularly adapted for testing in accordance with the present invention, that does not make it any less susceptible than previously known PLL circuits to the conditions being tested for, and therefore it is not inappropriate to discuss those conditions in the context of PLL circuit 10.

As seen in FIG. 1, PLL circuit 10 includes a phase-frequency detector ("PFD") 11 having an input 110 which is the input of the PLL to which the input reference signal is applied. The outputs 111 of PFD 11 are input to charge pump 12, whose output 121 is the control voltage input to loop filter 13 and to voltage-controlled oscillator ("VCO") 14. The output of VCO 14 is the output 101 of PLL circuit 10 (except as noted below), and also is fed back to PFD 11. As is well known, PFD 11 reacts to any phase or frequency difference between the feedback signal 101 and the input reference signal 110 by outputting an UP or DOWN signal 111 that causes charge pump 12 to either charge or discharge loop filter 13, raising or lowering control voltage 121, which in turn adjusts the frequency and/or phase of output signal 101.

The ultimate output signal 102 can be adjusted using optional scale counters 15, 16, 17. Input scale counter 15 will divide the frequency of input signal 110 by N. Output scale counter 16 will divide the frequency of output 101 by G. Feedback scale counter 17 will multiply the frequency of output 101 by M. Thus, the output frequency will be the input frequency multiplied by M/NG.

As stated above, known testing methods for PLLs test whether or not the circuit locks onto the reference input signal, but do not test for drift of the output that may result from, e.g., leakage currents within the circuit—particularly within charge pump 12 and loop filter 13. The effects of such leakage currents can be explained with reference to FIGS. 2–5.

Figure 2:
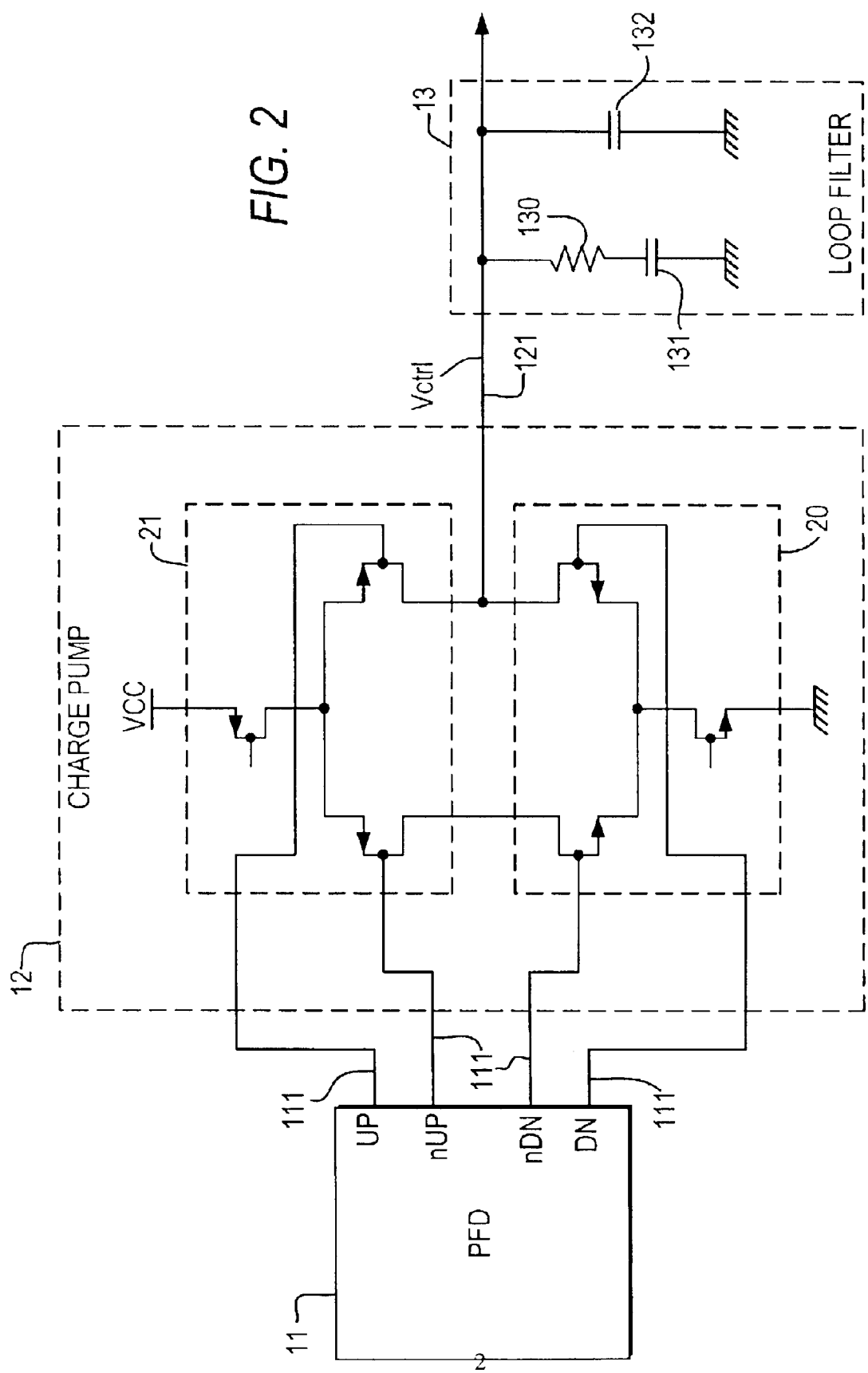
FIG. 2 shows a schematic representation of a charge pump and loop filter in a phase-locked loop circuit, such as that of the present invention.
Figure 3:
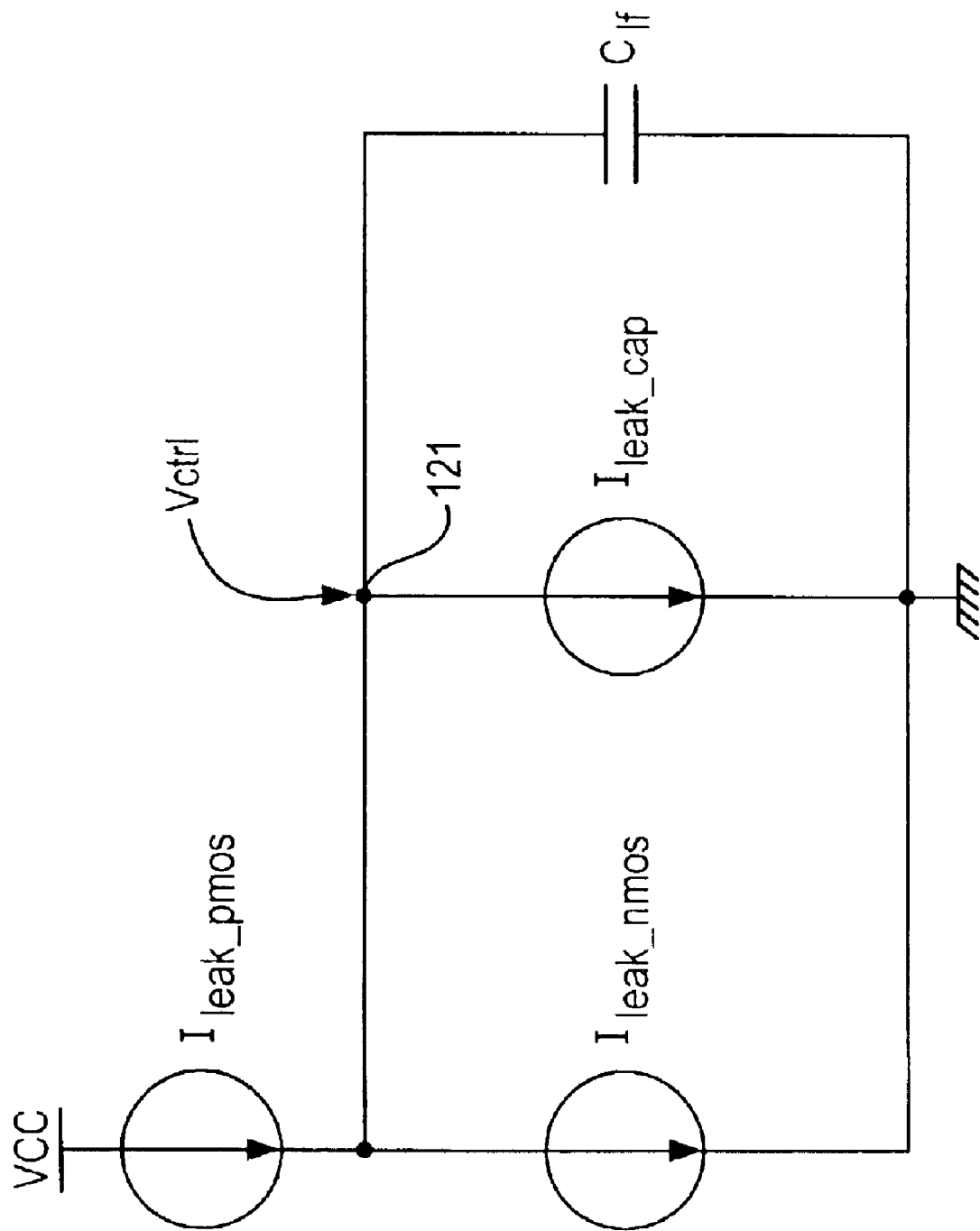
FIG. 3 is a representation of a leakage current model of the charge pump and loop filter of the circuit of FIG. 1.

FIG. 2 shows a simplified diagram of the charge pump 12 and loop filter 13, along with a schematic representation of PFD 11. If charge pump 12 is disabled so that it does not charge or discharge loop filter 13, then the model shown in FIG. 3 can be used to describe the behavior of charge pump 12 and loop filter 13. The drift of the control voltage at node 121 may be expressed as:

$$\Delta V_{CTRL} = (I_{leak\_pmos} - I_{leak\_nmos} - I_{leak\_cap}) \Delta t / C_{lf},$$

where $C_{lf}$ is low-frequency capacitor 131. The control voltage cannot be directly observed without providing an additional output pin, so another method must be used to determine if there is excessive leakage current. One such method is to disable the feedback loop 101 so that charge pump 12 is not trying to adjust the control voltage. In accordance with the invention, one preferred way of doing that is using a modified phase-frequency detector as discussed below. However, regardless of how charge pump 12 is disabled, once that is done, only leakage currents will affect the control voltage 121.

Figure 4:
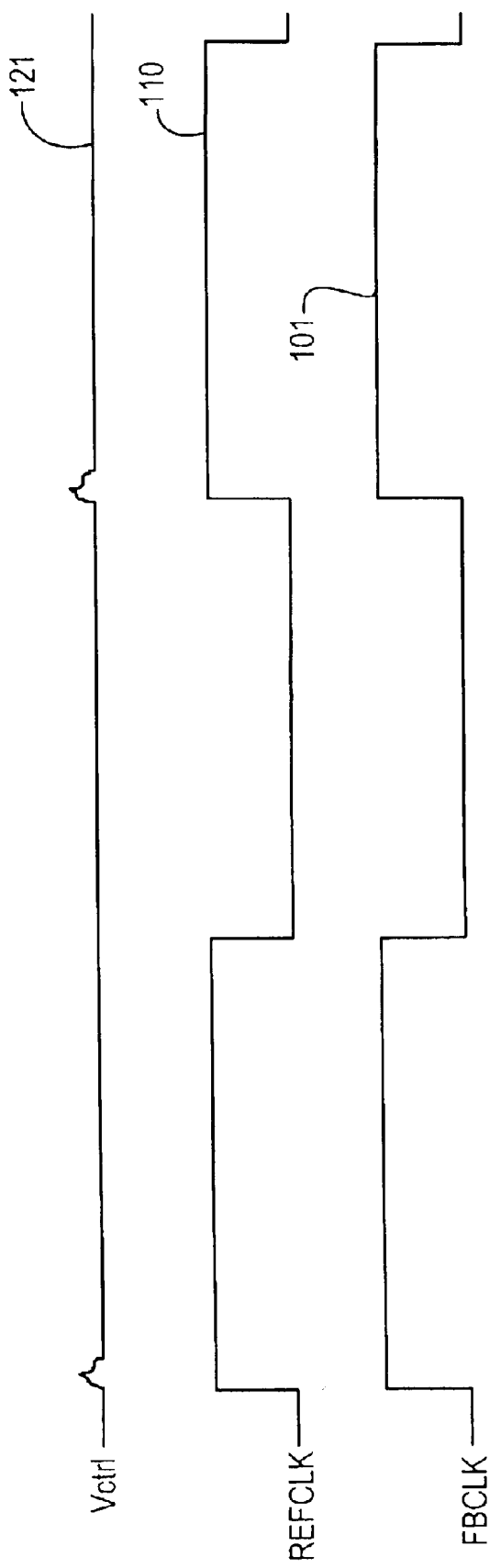
FIG. 4 is an illustration of relationship of the control voltage to the input and feedback signals in the circuit of FIG. 1 in the absence of leakage current.

Specifically, as seen in FIG. 4, for the case without leakage current, a small amount of noise is coupled to control voltage 121 at every rising edge of the reference and feedback clocks 110, 101, but control voltage 121 remains constant, and clocks 110, 101 remain in phase. Although as shown in FIG. 4, input clock 110 and output clock 101 have equal frequencies, that is not necessary, as long as the ratio of the frequencies is known as discussed below.

Figure 5:
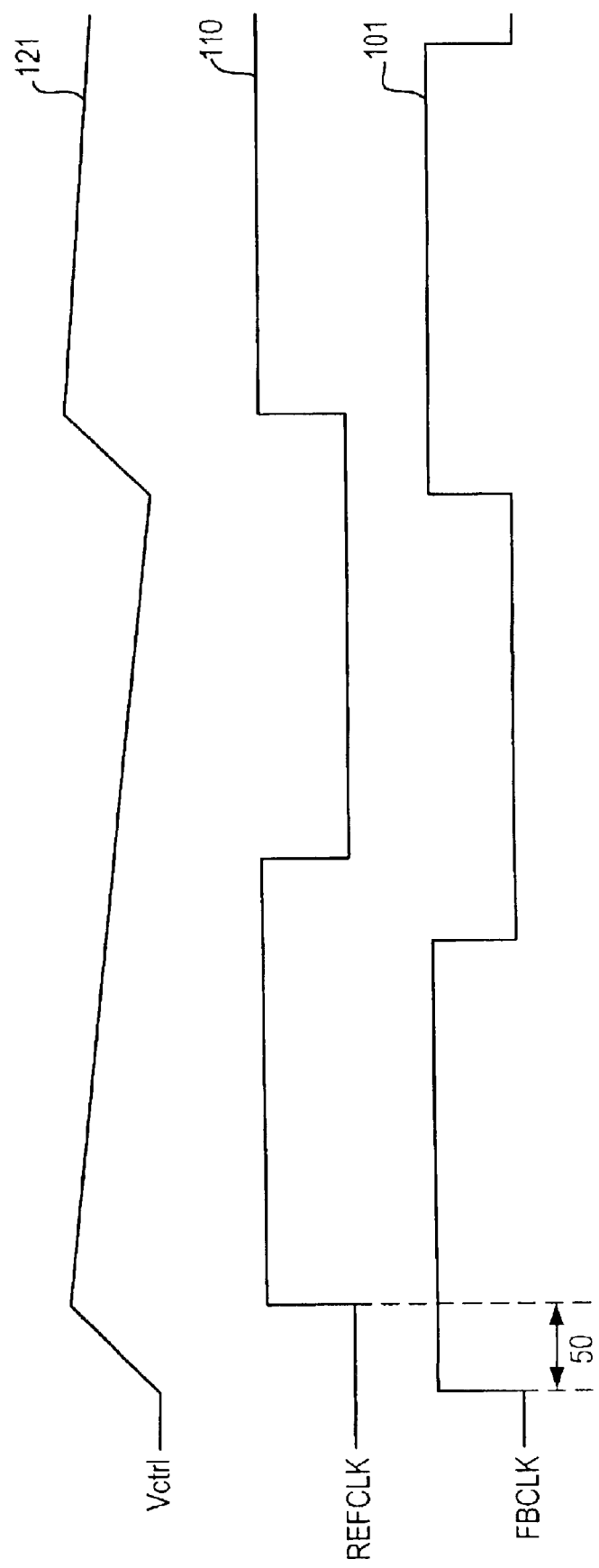
FIG. 5 is an illustration of the variation in the control voltage in the circuit of FIG. 1 in the presence of leakage current, and the effect on the output signal.

As seen in FIG. 5, for the case with leakage current, a static offset 50, in the form of a phase shift, is generated to compensate for the leakage current. Control voltage 121 thus assumes a sawtooth pattern as it rises on each cycle as a result of the leakage current until the compensation effect causes it to fall back to its nominal value over the remainder of each cycle. This variation of control voltage 121 over the clock cycle will cause deterministic jitter on output 101. Therefore, it is important to know if there are leakage currents in the circuit 10.

In accordance with a preferred embodiment of the present invention, in order to test circuit 10, a known input clock signal 110 is supplied and circuit 10 is allowed to lock. START signal 18 is then enabled. As discussed below in connection with FIG. 6, application of START signal 18 to PFD 11 preferably drives the PFDUP and PFDDN signals low, so that neither the UP nor DOWN charge pump of charge pump 12 is turned ON. Control voltage 121 is therefore free to float, and will remain constant in the absence of leakage current, so that in the absence of leakage current the frequencies of outputs 101 and 102 will not change once START signal 18 is applied. If, from the time START signal 18 is applied, input signal 110 is directed also to reference counter 19 and output 102 is directed to test counter 100 (with both counters 19, 100 enabled by START signal 18 for the purposes of the test), the relative values in counters 19, 100 would be expected to remain about the same (or to maintain a ratio of about G), although some variation may be tolerated.

Figure 6:
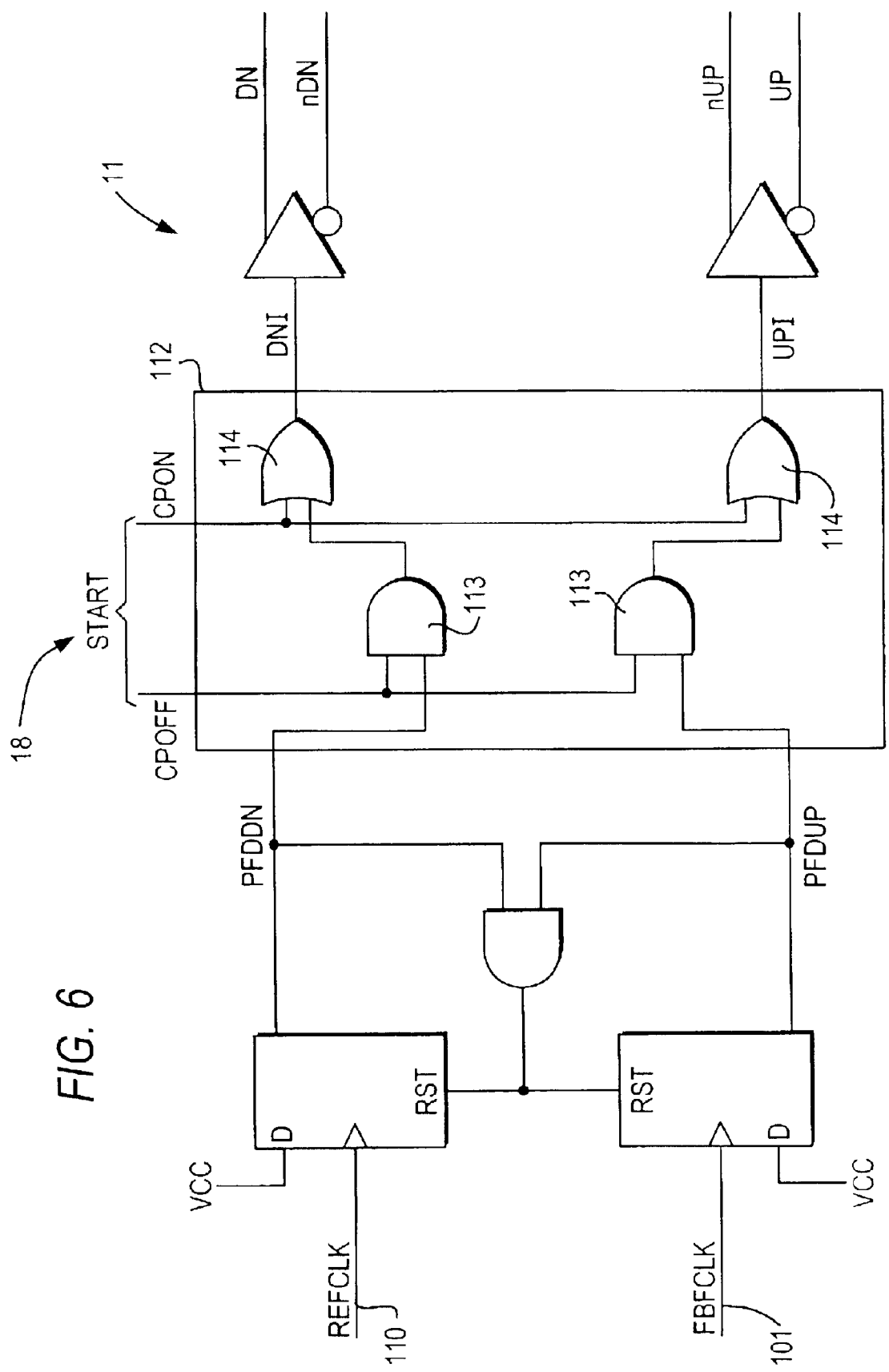
FIG. 6 is a schematic representation of a preferred embodiment of a phase-frequency detector in accordance with the present invention for controlling the charge pump to carry out the method according to the invention.

FIG. 6 shows the internal logic of PFD 11. The control block 112 is added in accordance with the present invention to respond to START signal 18. START signal 18 can be connected to charge_pump_ON signal CPON, charge_pump_OFF signal CPOFF, or both. As can be seen from FIG. 6, if CPON and CPOFF are both low, both the UP and DN signals from PFD 11 to charge pump 12 will be off, disabling charge pump 12 by keeping both the UP and DOWN charge pumps off. If CPON is high, then both the UP and DN signals from PFD 11 to charge pump 12 will be high (regardless of the state of CPOFF), disabling charge pump 12 by forcing both the UP and DOWN charge pumps on, working against one another so that the control voltage at node 121 is about zero, but also revealing charge pump mismatch, if any.

It should be noted that control block 112 could be implemented with only AND gates 113 and the CPOFF input, or with only OR gates 114 and the CPON input. Alternatively, although both AND gates 113 and OR gates 114 are provided, one of the CPON or CPOFF inputs could be tied to a fixed value. In a preferred embodiment only AND gates 113 and the CPOFF input is provided.

The following truth table shows the possible states of control block 112, where "X" indicates "Don't Care":

| CPON | CPOFF | PFDUP | PFDDN | UPI | DNI | UP | nUP | DN | nDN | Note |
|---|---|---|---|---|---|---|---|---|---|---|
| 1 | X | X | X | 1 | 1 | 0 | 1 | 1 | 0 | 1 |
| 0 | 0 | X | X | 0 | 0 | 1 | 0 | 0 | 1 | 2 |
| 0 | 1 | 0 | 0 | 0 | 0 | 1 | 0 | 0 | 1 | 3 |
| 0 | 1 | 0 | 1 | 0 | 1 | 1 | 0 | 1 | 0 | 3 |
| 0 | 1 | 1 | 0 | 1 | 0 | 0 | 1 | 0 | 1 | 3 |
| 0 | 1 | 1 | 1 | 1 | 1 | 0 | 1 | 1 | 0 | 3 |

The following notes apply:
1. Force charge pump on to enable both the up and down currents to measure charge pump mismatch
2. Force charge pump off to measure the net loop filter and charge pump leakage current.
3. Normal mode of operation.

The test should be allowed to run for a minimum time sufficient for a noticeable difference to accumulate. In a preferred embodiment such as that described, that minimum period preferably is long enough for reference counter 19 to reach a count of 2048. There is no maximum for the purposes of the test, but for production reasons, it would be undesirable to exceed the minimum necessary duration.

The magnitude of any leakage current can be calculated as follows:

First, simplify:

$$I_{leak\_pmos} - I_{leak\_nmos} - I_{leak\_cap} = I_{leak}.$$

Therefore:

$$\Delta V_{CTRL} = I_{leak} \Delta t / C_{lf}.$$

The change, if any, in the frequency of output 101 may be written as:

$$\Delta f_{VCO} = K_{VCO} I_{leak} \Delta t / C_{lf},$$

where $K_{VCO}$ is the gain of VCO 14. Because $\Delta f_{PLL} = \Delta f_{VCO} / G$, then $$\Delta f_{PLL} = K_{VCO} I_{leak} \Delta t / (G C_{lf})$$

or:

$$I_{leak} = \Delta f_{PLL} G C_{lf}/(K_{VCO} \Delta t)$$

The value stored in reference counter 18 is:

$N_{ref} = f_{ref} \Delta t$ (from which we can derive $\Delta t = N_{ref}/f_{ref}$), and $$N_{PLL} = f_{average} \Delta t = (f_{ref} + 0.5\Delta f_{PLL}) \Delta t,$$

where $\Delta f_{PLL}$ is a signed quantity. Solving for $\Delta f_{PLL}$ yields:

$$\Delta f_{PLL} = 2 \, ((N_{PLL} - N_{ref})/\Delta t)$$

Therefore, $$I_{leak} = 2 G C_{lf}((N_{PLL} - N_{ref})/\Delta t)/(K_{VCO} \Delta t)$$

$$I_{leak} = 2 G C_{lf}(N_{PLL} - N_{ref})/(K_{VCO}(\Delta t^2)).$$

Substituting $\Delta t = N_{ref}/f_{ref}$ from above yields:

$$I_{leak} = (2 G C_{lf}(f_{ref}^2)/K_{VCO})((N_{PLL} - N_{ref})/(N_{ref}^2)). \quad \text{(Equation 1)}$$

This equation yields the leakage current in terms of the measured counter values, the known scale value G, and the quantities $C_{lf}$ and $K_{VCO}$. Although the latter two quantities are considered to be known in any particular case, they can vary as a result of process conditions, temperature and voltage. Thus, the equation yields an estimate whose accuracy is determined by the possible ranges of those variations.

The foregoing analysis does not take into account the possibility of balance among the three components of $I_{leak}$—i.e., $I_{leak\_pmos}$, $I_{leak\_nmos}$ and $I_{leak\_cap}$ at the test voltage, making the PLL appear to pass the test, but allowing phase or frequency errors under operating conditions at different control voltages. If $I_{leak\_cap} = 0$ and $I_{leak\_pmos}$ and $I_{leak\_nmos}$ are balanced, that is not a problem because the control voltage node would not be affected. However, if under the test conditions, one of $I_{leak\_pmos}$ and $I_{leak\_nmos}$ is zero, and the other of $I_{leak\_pmos}$ and $I_{leak\_nmos}$ is non-zero and balances $I_{leak\_cap}$ which also is non-zero, or both $I_{leak\_pmos}$ and $I_{leak\_nmos}$ are non-zero but different and the difference is balanced by $I_{leak\_cap}$, then under operating conditions that balance might not be maintained, allowing phase or frequency errors.

This condition can be tested for by testing PLL circuit 10 twice using two different charge pump reference currents. Ideally, for a given applied charge pump reference current, the reference current in the NMOS portion 20 of charge pump 12 is identical to the reference current in the PMOS portion 21 of charge pump 12. In practice, however, $$I_{ref\_pmos} = C I_{ref\_nmos},$$

where $0.9 < C < 1.1$ as a function of voltage, equalling 1 only at a particular voltage. Similarly, $$I_{leak\_pmos} = A I_{ref\_pmos}$$

and $$I_{leak\_nmos} = B I_{ref\_nmos},$$

where A and B are constants. In view of these relationships, if one tests twice, using two different charge pump reference currents, any balance that may exist among $I_{leak\_pmos}$, $I_{leak\_nmos}$ and $I_{leak\_cap}$ at one charge pump reference current will be lost at a different charge pump reference current, allowing an accurate determination of the leakage currents.

For example, in performing a test according to a preferred embodiment of the method of the present invention, a clock input of, e.g., about 20 MHz may be applied to PLL circuit 10. The charge pump reference current may be set to 50 μA, and loop filter 13 should be configured with resistor 130 having a resistance R≈1 kΩ and high-frequency capacitor 132 having a capacitance $C_{hf}$≈20 pF. VCO 14 preferably is set to about the middle of its operating range (e.g., in a preferred embodiment, about 720 MHz). Output 102 from PLL circuit 10 should be routed to test counter 100 and the reference clock 110 should be routed to a reference counter 19. Input scale counter 15 counter preferably is set for bypass mode (N=1), while both output scale counter 16 and feedback scale counter 17 preferably are set to G=M=36.

PLL circuit 10 should be allowed to lock to reference clock 110. Once PLL circuit 10 locks, phase-frequency detector 11 should be disabled, while counters 19, 100 should be enabled, by asserting START signal 18. Counters 19, 100 preferably should be run until reference counter 19 reaches a count of 2048 (after about 102.4 μs), at which point both counters 19, 100 preferably should be disabled by deasserting START signal 18.

In a preferred embodiment, if the value in test counter 19 is less than 2048, then the leakage current is negative which implies that a leakage exists between control voltage node 121 and ground. In that embodiment, if the value in test counter 19 is greater than 2048, then the leakage current is positive which implies that a leakage exists between control voltage node 121 and $V_{cc}$. Note, however, that in other embodiments, the frequency could decrease with increasing control voltage and increase with decreasing control voltage, in which case a higher count would signify a negative leakage current and a lower count would signify a positive leakage current.

The values in counters 19, 100 can be read and then used in Equation 1, above, to determine the leakage current. Because $K_{VCO}$ and $C_{lf}$ typically have known tolerances, Equation 1 can actually be used to compute a range of leakage currents.

As discussed above, in order to be more certain that the leakage current is not being masked by a fortuitous balance among the various leakage currents in charge pump 12, the test preferably should be repeated with the charge pump current set to a different value, such as, e.g., 23 μA.

At both charge pump current settings, the acceptable difference in this preferred embodiment between the two counters 19, 100 is ±25. If the count measured for the two charge pump currents is the same, then the most likely source of the leakage current is loop filter 13, whereas if the counts are different, the most likely source of leakage current is charge pump 12.

It should be noted that although in PLL circuit 10 as described, counters 19, 100 are used to monitor the output frequency for changes that might indicate leakage, other monitoring devices could be used. For example, one might use an appropriately configured oscilloscope, frequency counter or spectrum analyzer.

Figure 7:
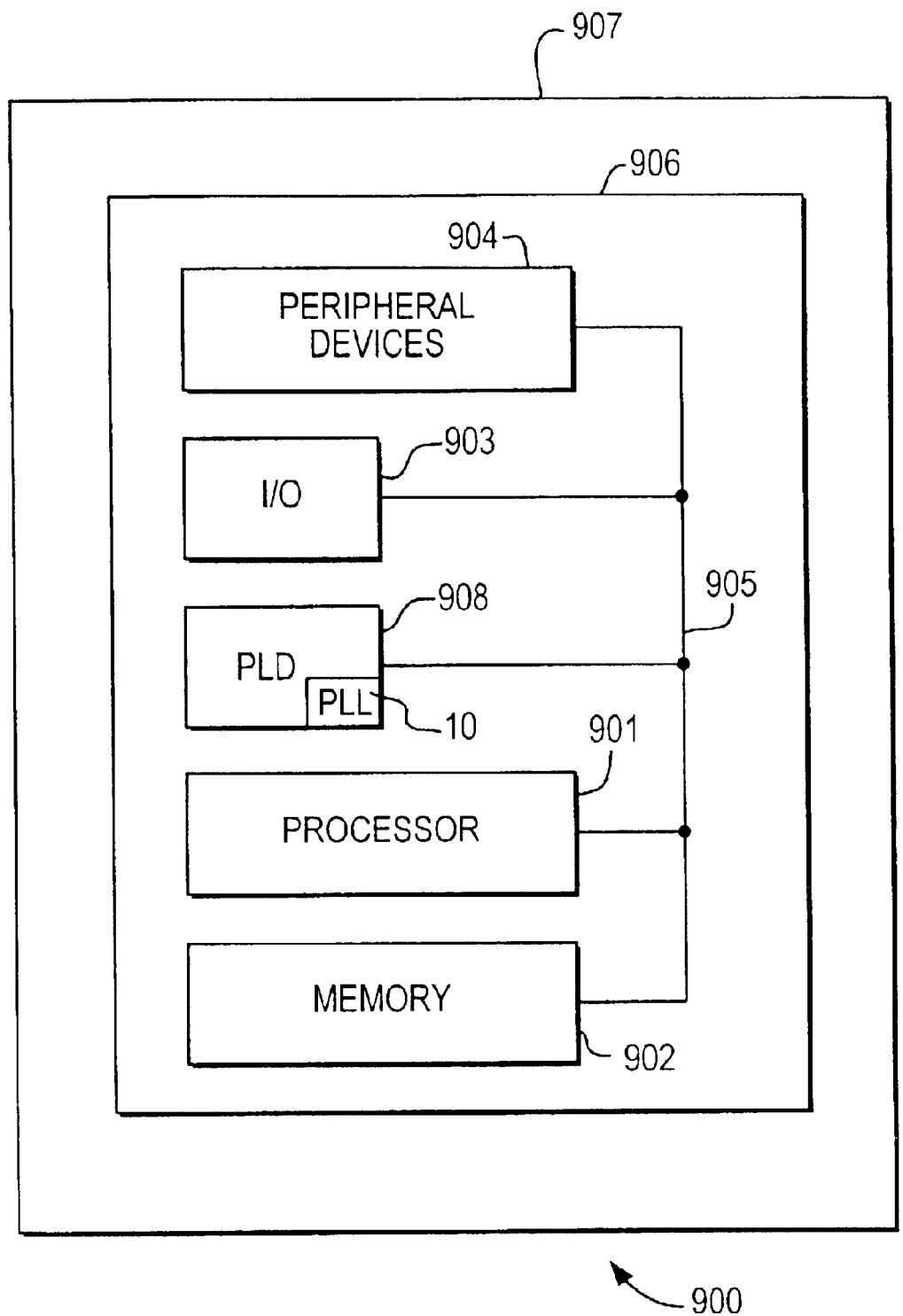
FIG. 7 is a simplified block diagram of an illustrative system employing a programmable logic device incorporating a phase-locked loop in accordance with the present invention.

PLL circuit 10 according to the present invention may be used in many kinds of electronic devices. One possible use is in a programmable logic device ("PLD") 908 of a type that requires an accurate frequency standard. For example, PLD 908 may be of a type using the Low Voltage Differential Signaling ("LVDS") input/output ("I/O") standard. Such a PLD 908 may be used as part of a data processing system 900 shown in FIG. 7. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 908 can be used to perform a variety of different logic functions. For example, PLD 908 can be configured as a processor or controller that works in cooperation with processor 901. PLD 908 may also be used as an arbiter for arbitrating access to a shared resources in system 900. In yet another example, PLD 908 can be configured as an interface between processor 901 and one of the other components in system 900. It should be noted that system 900 is only exemplary, and that the true scope and spirit of the invention should be indicated by the following claims.

Various technologies can be used to implement PLDs 908 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method of testing a phase-locked loop comprising, in series, a phase-frequency detector, a charge pump, a loop filter and a voltage-controlled oscillator, said voltage-controlled oscillator providing a loop output that is fed back to an input of said phase-frequency detector, said loop output having an output frequency, said method comprising:

inputting a reference signal to said phase-locked loop;
    allowing said phase-locked loop to lock onto said reference signal;
    discontinuing feeding back of said loop output by disabling said charge pump; and
    monitoring said loop output after said discontinuing for change in said output frequency.

2. The method of claim 1 wherein:

said phase-frequency detector has an UP output and a DOWN output; and
    said disabling comprises forcing said UP output and said DOWN output to identical states.

3. The method of claim 2 wherein said forcing comprises turning off both said UP output and said DOWN output.

4. The method of claim 3 wherein:

said charge pump has an adjustable charge current;
    said method further comprising:
        adjusting said charge current to a first value prior to said inputting;
        adjusting said charge current to a second value after said monitoring; and
        repeating said inputting, said allowing, said discontinuing and said monitoring.

5. The method of claim 4 wherein said monitoring comprises:

directing said reference signal to a first counter during an interval of predetermined duration;
    directing said loop output to a second counter during said interval;
    after said interval has elapsed, stopping said first and second counters, respectively, from counting said reference signal and said loop output; and
    comparing outputs of said first and second counters.

6. The method of claim 5 wherein said directing said loop output to a second counter comprises directing said loop output to said second counter through a scaling counter.

7. The method of claim 3 wherein said monitoring comprises:

directing said reference signal to a first counter during an interval of predetermined duration;
    directing said loop output to a second counter during said interval;
    after said interval has elapsed, stopping said first and second counters, respectively, from counting said reference signal and said loop output; and
    comparing outputs of said first and second counters.

8. The method of claim 7 wherein said directing said loop output to a second counter comprises directing said loop output to said second counter through a scaling counter.

9. The method of claim 2 wherein said forcing comprises turning on both said UP output and said DOWN output.

10. The method of claim 9 wherein:

said charge pump has an adjustable charge current;
    said method further comprising:
        adjusting said charge current to a first value prior to said inputting;
        adjusting said charge current to a second value after said monitoring; and
        repeating said inputting, said allowing, said discontinuing and said monitoring.

11. The method of claim 10 wherein said monitoring comprises:

directing said reference signal to a first counter during an interval of predetermined duration;
    directing said loop output to a second counter during said interval;
    after said interval has elapsed, stopping said first and second counters, respectively, from counting said reference signal and said loop output; and
    comparing outputs of said first and second counters.

12. The method of claim 11 wherein said directing said loop output to a second counter comprises directing said loop output to said second counter through a scaling counter.

13. The method of claim 9 wherein said monitoring comprises:

directing said reference signal to a first counter during an interval of predetermined duration;
    directing said loop output to a second counter during said interval;
    after said interval has elapsed, stopping said first and second counters, respectively, from counting said reference signal and said loop output; and
    comparing outputs of said first and second counters.

14. The method of claim 13 wherein said directing said loop output to a second counter comprises directing said loop output to said second counter through a scaling counter.

15. The method of claim 1 wherein:

said charge pump has an adjustable charge current;
    said method further comprising:
        adjusting said charge current to a first value prior to said inputting;
        adjusting said charge current to a second value after said monitoring; and repeating said inputting, said allowing, said discontinuing and said monitoring.

16. The method of claim 15 wherein said monitoring comprises:
    directing said reference signal to a first counter during an interval of predetermined duration;
    directing said loop output to a second counter during said interval;
    after said interval has elapsed, stopping said first and second counters, respectively, from counting said reference signal and said loop output; and
    comparing outputs of said first and second counters.

17. The method of claim 16 wherein said directing said loop output to a second counter comprises directing said loop output to said second counter through a scaling counter.

18. The method of claim 1 wherein said monitoring comprises:
    directing said reference signal to a first counter during an interval of predetermined duration;
    directing said loop output to a second counter during said interval;
    after said interval has elapsed, stopping said first and second counters, respectively, from counting said reference signal and said loop output; and
    comparing outputs of said first and second counters.

19. The method of claim 18 wherein said directing said loop output to a second counter comprises directing said loop output to said second counter through a scaling counter.

20. Apparatus for testing a phase-locked loop, said phase-locked loop comprising, in series, a phase-frequency detector, a charge pump, a loop filter and a voltage-controlled oscillator, said voltage-controlled oscillator providing an oscillator output that is fed back to an input of said phase-frequency detector, said oscillator output having an oscillator frequency, said apparatus comprising:
    means for inputting a reference signal to said phase-locked loop;
    means for discontinuing feeding back of said oscillator output by disabling said charge pump; and
    means for monitoring said oscillator output for change in said oscillator frequency after said discontinuing.

21. The apparatus of claim 20 wherein:
    said phase-frequency detector has an UP output and a DOWN output; and
    said means for discontinuing by disabling comprises means for forcing said UP output and said DOWN output to identical states.

22. The apparatus of claim 21 wherein said means for forcing comprises means for turning off both said UP output and said DOWN output.

23. The apparatus of claim 22 wherein:
    said charge pump has an adjustable charge current;
    said apparatus further comprising:
        means for adjusting said charge current to at least a first value and a second value; whereby:
    said apparatus may be operated first with said charge current at said first value and second with said charge current at said second value.

24. The apparatus of claim 23 wherein said means for monitoring comprises:
    a first counter having said reference signal as an input; and
    a second counter having said oscillator output as an input.

25. The apparatus of claim 24 wherein:
    said second counter is a scaling counter providing a scaled output; and
    said means for monitoring further comprises a third counter having said scaled output as an input.

26. The apparatus of claim 22 wherein said means for monitoring comprises:
    a first counter having said reference signal as an input; and
    a second counter having said oscillator output as an input.

27. The apparatus of claim 26 wherein:
    said second counter is a scaling counter providing a scaled output; and
    said means for monitoring further comprises a third counter having said scaled output as an input.

28. The apparatus of claim 27 wherein:
    said charge pump has an adjustable charge current;
    said apparatus further comprising:
        means for adjusting said charge current to at least a first value and a second value; whereby:
    said apparatus may be operated first with said charge current at said first value and second with said charge current at said second value.

29. The apparatus of claim 28 wherein said means for monitoring comprises:
    a first counter having said reference signal as an input; and
    a second counter having said oscillator output as an input.

30. The apparatus of claim 29 wherein:
    said second counter is a scaling counter providing a scaled output; and
    said means for monitoring further comprises a third counter having said scaled output as an input.

31. The apparatus of claim 27 wherein said means for monitoring comprises:
    a first counter having said reference signal as an input; and
    a second counter having said oscillator output as an input.

32. The apparatus of claim 31 wherein:
    said second counter is a scaling counter providing a scaled output; and
    said means for monitoring further comprises a third counter having said scaled output as an input.

33. The apparatus of claim 32 wherein said means for monitoring comprises:
    a first counter having said reference signal as an input; and
    a second counter having said oscillator output as an input.

34. The apparatus of claim 33 wherein:
    said second counter is a scaling counter providing a scaled output; and
    said means for monitoring further comprises a third counter having said scaled output as an input.

35. The apparatus of claim 21 wherein said means for forcing comprises means for turning on both said UP output and said DOWN output.

36. The apparatus of claim 20 wherein:
    said charge pump has an adjustable charge current;
    said apparatus further comprising:
        means for adjusting said charge current to at least a first value and a second value; whereby:
    said apparatus may be operated first with said charge current at said first value and second with said charge current at said second value.

37. The apparatus of claim 20 wherein said means for monitoring comprises:
    a first counter having said reference signal as an input; and
    a second counter having said oscillator output as an input.

38. The apparatus of claim 37 wherein:
    said second counter is a scaling counter providing a scaled output; and said means for monitoring further comprises a third counter having said scaled output as an input.

39. A phase-locked loop circuit incorporating testing features, said phase-locked loop circuit comprising:

a reference signal input terminal;

a phase-frequency detector having a first detector input connected to said reference signal input terminal, and having a second detector input and a detector output;

a charge pump having a first pump input connected to said detector output, and having a pump output;

a loop filter having a filter input connected to said pump output, and having a filter output;

a voltage-controlled oscillator having an oscillator input connected to said filter output, said voltage-controlled oscillator providing an oscillator output that is fed back to said second detector input of said phase-frequency detector, said oscillator output having an oscillator frequency;

a feedback interruption circuit for discontinuing feeding back of said oscillator output by disabling said charge pump;

a first counter having said reference signal as an input; and a second counter having said oscillator output as an input; whereby:

when said phase-locked loop circuit is allowed to lock onto said reference signal and said feedback interruption circuit is actuated to discontinue feeding back of said oscillator output, a difference between said first and second counters after said discontinuing indicates a deviation in said oscillator frequency.

40. The phase-locked loop circuit of claim 39 wherein:

said phase-frequency detector has an UP output and a DOWN output; and said feedback interruption circuit forces said UP output and said DOWN output to identical states.

41. The phase-locked loop circuit of claim 40 wherein said feedback interruption circuit turns off both said UP output and said DOWN output.

42. The phase-locked loop circuit of claim 41 wherein:

said charge pump has an adjustable charge current; whereby:

said phase-locked loop circuit may be operated first with said charge current at said first value and second with said charge current at said second value.

43. The phase-locked loop circuit of claim 42 further comprising a scaling counter between said oscillator output and said second counter.

44. The phase-locked loop circuit of claim 41 further comprising a scaling counter between said oscillator output and said second counter.

45. The phase-locked loop circuit of claim 40 wherein said feedback interruption circuit turns on both said UP output and said DOWN output.

46. The phase-locked loop circuit of claim 45 wherein:

said charge pump has an adjustable charge current; whereby:

said phase-locked loop circuit may be operated first with said charge current at said first value and second with said charge current at said second value.

47. The phase-locked loop circuit of claim 46 further comprising a scaling counter between said oscillator output and said second counter.

48. The phase-locked loop circuit of claim 45 further comprising a scaling counter between said oscillator output and said second counter.

49. The phase-locked loop circuit of claim 48 further comprising a scaling counter between said oscillator output and said second counter.

50. The phase-locked loop circuit of claim 39 wherein:

said charge pump has an adjustable charge current; whereby:

said phase-locked loop circuit may be operated first with said charge current at said first value and second with said charge current at said second value.

51. The phase-locked loop circuit of claim 39 further comprising a scaling counter between said oscillator output and said second counter.

52. A programmable logic device comprising the phase-locked loop circuit of claim 39.

53. A digital processing system comprising:

processing circuitry;

a memory coupled to said processing circuitry; and a programmable logic device as defined in claim 52 coupled to the processing circuitry and the memory.

54. A printed circuit board on which is mounted a programmable logic device as defined in claim 52.

55. The printed circuit board defined in claim 54 further comprising:

memory circuitry mounted on the printed circuit board and coupled to the programmable logic device.

56. The printed circuit board defined in claim 55 further comprising:

processing circuitry mounted on the printed circuit board and coupled to the memory circuitry.

\* \* \* \* \*